United States Patent
Katsuhara (10) Patent No.: US 9,368,738 B2
(45) Date of Patent: Jun. 14, 2016

(54) THIN FILM TRANSISTOR AND METHOD OF MANUFACTURING THE SAME, AND ELECTRONIC APPARATUS

(75) Inventor: Mao Katsuhara, Kanagawa (JP)

(73) Assignee: Sony Corporation, Tokyo (JP)

( * ) Notice: Subject to any disclaimer, the term of this patent is extended or adjusted under 35 U.S.C. 154(b) by 125 days.

(21) Appl. No.: 13/472,247

(22) Filed: May 15, 2012

(65) Prior Publication Data

US 2012/0313150 A1 Dec. 13, 2012

(30) Foreign Application Priority Data

Jun. 13, 2011 (JP) ................................. 2011-131103

(51) Int. Cl.
*H01L 29/786* (2006.01)
*H01L 51/05* (2006.01)
*H01L 51/00* (2006.01)

(52) U.S. Cl.
CPC ........ *H01L 51/0562* (2013.01); *H01L 51/0017* (2013.01)

(58) Field of Classification Search
CPC .................................................. H01L 29/786
USPC ............ 257/288, E29.273, E21.409; 438/197
See application file for complete search history.

(56) References Cited

U.S. PATENT DOCUMENTS

| | | | |
|---|---|---|---|
| 2005/0185109 A1* | 8/2005 | Rho et al. | 349/44 |
| 2005/0242342 A1* | 11/2005 | Suh et al. | 257/40 |
| 2006/0097254 A1* | 5/2006 | Ahn et al. | 257/57 |
| 2006/0246620 A1* | 11/2006 | Nagayama et al. | 438/99 |
| 2006/0270066 A1* | 11/2006 | Imahayashi et al. | 438/4 |
| 2007/0117280 A1* | 5/2007 | Lee et al. | 438/149 |
| 2010/0090202 A1* | 4/2010 | Obata et al. | 257/40 |
| 2010/0276754 A1* | 11/2010 | Ohe et al. | 257/347 |

FOREIGN PATENT DOCUMENTS

| | | |
|---|---|---|
| JP | 2005-327797 | 11/2005 |
| JP | 2006-253675 | 9/2006 |
| JP | 2008-085200 | 4/2008 |
| JP | 2011077500 A * | 4/2011 |
| WO | WO 2009084307 A1 * | 7/2009 |

* cited by examiner

*Primary Examiner* — Jerome Jackson, Jr.
*Assistant Examiner* — Lamont Koo
(74) *Attorney, Agent, or Firm* — Sheridan Ross P.C.

(57) ABSTRACT

A thin film transistor includes: an organic semiconductor layer which is formed from a metal-containing material containing at least one of a metallic element and a semi-metallic element capable of reacting with an etching gas; a source electrode and a drain electrode spaced apart from each other; and an organic conductive layer which is inserted between the organic semiconductor layer and the source and drain electrodes in the regions where the organic semiconductor layer overlaps with the source and drain electrodes and which is formed from a non-metal-containing material not containing at least one of a metallic element and a semi-metallic element capable of reacting with the etching gas.

20 Claims, 5 Drawing Sheets

THIN FILM TRANSISTOR AND METHOD OF MANUFACTURING THE SAME, AND ELECTRONIC APPARATUS

CROSS REFERENCES TO RELATED APPLICATIONS

The present application claims priority to Japanese Priority Patent Application JP 2011-131103 filed in the Japan Patent Office on Jun. 13, 2011, the entire content of which is hereby incorporated by reference.

BACKGROUND

The present application relates to a thin film transistor having an organic semiconductor layer and a method of manufacturing the thin film transistor, and an electronic apparatus in which the thin film transistor is used.

In recent years, thin film transistors (TFTs) have been used in a diversity of electronic apparatuses, as switching elements or the like. Recently, organic TFTs in which an organic semiconductor material is used for forming a semiconductor layer constituting a channel layer have come to be deemed as promising, in place of inorganic TFTs in which an inorganic semiconductor material is used for forming the semiconductor layer. This is because in the organic TFTs, the channel layer can be formed by a coating method and, therefore, a lowered cost can be ensured. A further reason resides in that, since the channel layer can thus be formed at a lower temperature than in a vapor deposition method or the like, a plastic film or the like which is flexible and low in thermal resistance can be used as a support substrate.

Together with the organic semiconductor layer forming the channel layer, an organic TFT has a source electrode and a drain electrode which are connected to the organic semiconductor layer. The source electrode and the drain electrode are formed from a metallic material or the like. The positional relationship that the source electrode and the drain electrode have with the organic semiconductor layer is classified into two types, of which commonly used is the top contact type wherein the source electrode and the drain electrode are so disposed as to be on the upper side of and to overlap with the organic semiconductor layer (see, for example, Japanese Patent Laid-Open No. 2008-085200).

In this type of organic TFT, the source electrode and the drain electrode formed of a metallic material are connected to the organic semiconductor layer formed of an organic material, so that the charge injection efficiency therebetween may be insufficient. In view of this, it has been proposed to form an organic conductive layer such as a hole injection layer on the organic semiconductor layer so that the organic conductive layer is provided intermediately between the source and drain electrodes and the organic semiconductor layer (see, for example, Japanese Patent Laid-Open No. 2006-253675 and Japanese Patent Laid-Open No. 2005-327797).

SUMMARY

Where the organic conductive layer is provided on the organic semiconductor layer to extend over a region ranging from the region of the source electrode to the region of the drain electrode, however, a leakage current is liable to be generated between the electrodes due to the presence of the organic conductive layer, though the enhanced charge injection efficiency is ensured. In order to remove unnecessary portions of the organic conductive layer and thereby to prevent the generation of the leakage current, therefore, dry etching of the organic conductive layer by use of the source and drain electrodes as a mask has been investigated. An attempt to etch the organic conductive layer, however, would lead to etching of not only the organic conductive layer but also the organic semiconductor layer, resulting in that current paths are liable to be broken. In either of the cases, the charge injection efficiency is enhanced on the one hand, but the performance of the organic TFT is lowered on the other hand.

Thus, there is a need for a thin film transistor in which enhanced charge injection efficiency between source and drain electrodes and an organic semiconductor layer and good transistor performance can both be realized, a method of manufacturing such a thin film transistor, or an electronic apparatus in which such a thin film transistor is used.

According to an embodiment of the present application, there is provided a thin film transistor including: an organic semiconductor layer which is formed from a metal-containing material containing one of a metallic element and a semi-metallic element capable of reacting with an etching gas; a source electrode and a drain electrode spaced apart from each other; and an organic conductive layer which is inserted between the organic semiconductor layer and the source and drain electrodes in regions where the organic semiconductor layer overlaps with the source and drain electrodes and which is formed from a non-metal-containing material not containing one of a metallic element and a semi-metallic element capable of reacting with the etching gas.

According to another embodiment of the present application, there is provided an electronic apparatus provided with the above-mentioned thin film transistor.

According to a further embodiment of the present application, there is provided a method of manufacturing a thin film transistor, including: forming an organic semiconductor layer by use of a metal-containing material which contains one of a metallic element and a semi-metallic element capable of reacting with an etching gas; forming an organic conductive layer over the organic semiconductor layer by use of a non-metal-containing material which does not contain one of a metallic element and a semiconductor element capable of reacting with the etching gas; forming a source electrode and a drain electrode, which are spaced apart from each other, over the organic conductive layer; and etching the organic conductive layer by use of the etching gas, with the source and drain electrodes as a mask.

In the thin film transistor, the method of manufacturing the same or the electronic apparatus according to embodiments of the present application, the organic conductive layer formed from the non-metal-containing material is inserted between the organic semiconductor layer formed from the metal-containing material and the source and drain electrodes in the regions where the organic semiconductor layer overlaps with the source and drain electrodes. This ensures that the organic conductive layer is etched, with the source and drain electrodes as a mask. Accordingly, enhanced charge injection efficiency between the source and drain electrodes and the organic semiconductor layer and good transistor performance can both be attained.

Additional features and advantages are described herein, and will be apparent from the following Detailed Description and the figures.

DETAILED DESCRIPTION

Now, embodiments of the present application will be described in detail below, referring to the drawings. The description will be made in the following order.
1. Configuration of thin film transistor
2. Method of manufacturing thin film transistor
3. Modifications
4. Application examples (electronic apparatuses) of thin film transistor
4-1. Liquid crystal display
4-2. Organic EL display
4-3. Electronic paper display <1. Configuration of Thin Film Transistor>

Figure 1:
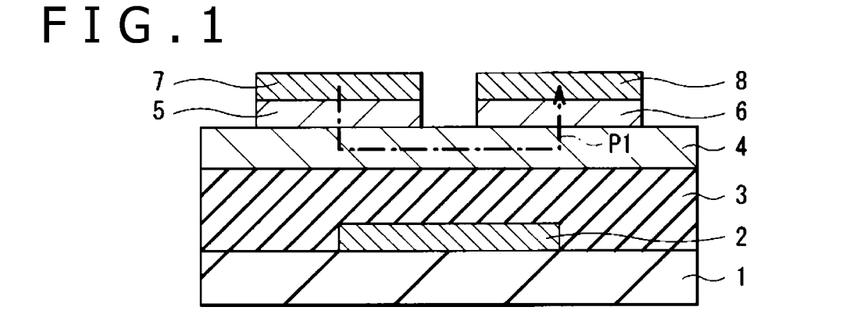
FIG. 1 is a sectional view illustrating the configuration of a thin film transistor in an embodiment of the present application.

First, the configuration of a thin film transistor according to an embodiment of the present application will be described. FIG. 1 illustrates a sectional configuration of the thin film transistor.

The thin film transistor described here is an organic TFT which has an organic semiconductor layer 4 as a channel layer. In this organic TFT, for example, a gate electrode 2, a gate insulating layer 3, the organic semiconductor layer 4, organic conductive layers 5, 6, a source electrode 7 and a drain electrode 8 are stacked in this order over a support substrate 1. Thus, the organic TFT shown in FIG. 1 is of a top-contact bottom-gate type in which the source electrode 7 and the drain electrode 8 are disposed on the upper side of the organic semiconductor layer 4 and in which the gate electrode 2 is disposed on the lower side of the organic semiconductor layer 4. Incidentally, the "upper side" means the side farther from the support substrate 1, and the "lower side" means the side nearer to the support substrate 1.

The support substrate 1 is formed from, for example, at least one selected from among such materials as plastic materials, metallic materials, and inorganic materials.

Examples of the plastic materials include polymethyl methacrylate (PMMA), polyvinyl alcohol (PVA), polyvinyl phenol (PVP), polyether sulfone (PES), polycarbonates (PC), polyimides (PI), polyethylene terephthalate (PET), polyethylene naphthalate (PEN), polyethyl ether ketone (PEEK), polyacrylates (PAR), polyphenylene sulfide (PPS), and tri-acetyl cellulose (TAC). Examples of the metallic materials include aluminum (Al), nickel (Ni), and stainless steel. Examples of the inorganic materials include silicon (Si), silicon oxide ($SiO_x$), silicon nitride ($SiN_x$), aluminum oxide ($AlO_x$), and other metallic oxides. It is to be noted that silicon oxide includes glasses, quartz, spin-on-glass (SOG) and the like.

The support substrate 1 may be a rigid substrate such as a wafer, or may be a flexible film or foil. In addition, the support substrate 1 may be provided on its surface with a coating layer having a predetermined function. The coating layer may, for example, be a buffer layer for securing adhesion, a gas barrier layer for preventing release of gas, or a layer having other function.

The support substrate 1 may have a monolayer structure or a multilayer structure. In the case of a multilayer structure, two or more layers of the above-mentioned materials are stacked on one another. The condition where the structure may be a monolayer structure or a multilayer structure applies also to the gate electrode 2, the gate insulating layer 3, the organic semiconductor layer 4, the organic conductive layers 5, 6, the source electrode 7 and the drain electrode 8.

The gate electrode 2 is provided on the support substrate 1, and includes, for example, at least one selected from among metallic materials, inorganic conductive materials, organic conductive materials, carbon materials and the like.

Examples of the metallic materials include aluminum, copper (Cu), molybdenum (Mo), titanium (Ti), chromium (Cr), nickel, palladium (Pd), gold (Au), silver (Ag), platinum (Pt), tungsten (W), tantalum (Ta), and their alloys. Examples of the inorganic conductive materials include indium oxide ($In_2O_3$), indium tin oxide (ITO), indium zinc oxide (IZO), and zinc oxide (ZnO). Examples of the organic conductive materials include polyethylenedioxythiophene (PEDOT), polystyrene-sulfonic acid (PSS), and polyaniline (PANT). Examples of the carbon materials include graphite. Incidentally, the gate electrode 2 may have a multilayer structure of PEDOT/PSS, for example.

The gate insulating layer 3 is provided so as to cover at least the gate electrode 2. The gate insulating layer 3 includes at least one selected from among inorganic insulating materials and organic insulating materials, for example. Examples of the inorganic insulating materials include silicon oxide, silicon nitride, aluminum oxide, titanium oxide ($TiO_2$), hafnium oxide ($HfO_x$), and barium titanate ($BaTiO_3$). Examples of the organic insulating materials include polyvinyl phenol (PVP), polyvinyl alcohol (PVA), polyimides, polyamides, polyesters, polyacrylates, polymethacrylate acrylates, epoxy resins, benzocyclobutene (BCB), fluoro-resins, photosensitive polyimides, photosensitive novolak resins, and polyparaxylylene.

The organic semiconductor layer 4 is provided on the gate insulating layer 3, and includes a material (metal-containing material) containing at least one (hereinafter referred to as "the metallic element or the like") of a metallic element and a semi-metallic element which are capable of reacting with an etching gas.

The metal-containing material is a material which, when etched by a dry etching method using an arbitrary etching gas in a process of manufacturing an organic TFT, is capable of forming a reaction product of the metallic element or the like and a component of the etching gas. As will be described later, the reaction product is built up on the surface of the organic semiconductor layer 4 at the time of etching, thereby functioning to substantially stop the progress of the etching treatment, in other words, functioning as an etching stopper.

The metallic element is, for example, at least one selected from the group consisting of beryllium (Be), magnesium (Mg), aluminum, calcium (Ca), scandium (Sc), titanium, vanadium (V), chromium, manganese (Mn), iron (Fe), cobalt (Co), nickel, copper, zinc (Zn), gallium (Ga), strontium (Sr), yttrium (Y), zirconium (Zr), niobium (Nb), molybdenum, technetium (Tc), ruthenium (Ru), rhodium (Rh), palladium, silver, cadmium (Cd), indium (In), tin (Sn), barium (Ba), hafnium (Hf), tantalum, tungsten, rhenium (Re), osmium (Os), iridium (Ir), platinum, gold, mercury (Hg), thallium (Tl), lead (Pb), bismuth (Bi), and polonium (Po), and may also be other metallic element. On the other hand, the semi-metallic element is, for example, at least one selected from the group consisting of boron (B), silicon, germanium (Ge), arsenic (As), antimony (Sb) and tellurium (Te), and may also be other semi-metallic element. Besides, it suffices that the metallic element and the semi-metallic element are at least one of the above-mentioned series of metallic elements and at least one of the above-mentioned series of semi-metallic elements, respectively.

Specifically, the metal-containing material is, for example, an organic semiconductor material having a group (metal-containing group) which contains the metallic element or the like, or an organometallic complex containing the metallic element or the like. The metal-containing group contains, for example, silicon, which is a semi-metallic element, and the number of the metal-containing group(s) may be one or may be two or more. The metal-containing group which contains silicon is, for example, a silylalkyl group such as triisopropylsilylethynyl group (TIPS) or triethylsilylethynyl group (TES), and may also be other silylalkyl group. While the details of the organic semiconductor material will be described later, specific examples of the organic semiconductor material having the metal-containing group include TIPS-pentacene and TES-anthradithiophene. Specific examples of the organometallic complex include metal phthalocyanine, metal dithiolate complexes, and tris(8-quinolinolato)aluminum (Alq-3).

Incidentally, the composition of the etching gas is not particularly restricted, insofar as it enables formation of a reaction product of the metallic element or the like. Among the applicable etching gas compositions, those containing an active gas are preferable. The reason resides in that an active gas is excellent in reactivity and, hence, promises easy formation of the reaction product. The active gas is, for example, at least one of oxygen ($O_2$) and halogens, and may also be other active gas. The halogens may be, for example, at least one of fluorine ($F_2$), chlorine ($Cl_2$) and the like.

In the case where the etching gas contains oxygen as an active gas, among others, it is preferable that the metal-containing material contains silicon as a constituent element. More specifically, the metal-containing material is preferably an organic semiconductor material having a silylalkyl group, or the like. The reason lies in that, since silicon is highly reactive with oxygen, a reaction product (silicon oxide) of silicon and oxygen is easily formed at the time of etching of the organic semiconductor layer 4. A further reason resides in that, since silicon oxide has a sufficient etching resistance, the progress of the etching treatment can be substantially stopped when the organic semiconductor layer 4 has been etched only slightly.

Incidentally, the organic semiconductor material contains at least one of the following materials: (1) polypyrrole; (2) polythiophene; (3) isothianaphthene such as polyisothianaphthene; (4) thienylenevinylene such as polythienylenevinylene; (5) poly(p-phenylenevinylene); (6) polyaniline; (7) polyacetylene; (8) polydiacetylene; (9) polyazulene; (10) polypyrene; (11) polycarbazole; (12) polyselenophene; (13) polyfuran; (14) poly(p-phenylene); (15) polyindole; (16) polypyridazine; (17) acenes such as naphthacene, pentacene, hexacene, heptacene, dibenzopentacene, tetrabenzopentacene, pyrene, dibenzopyrene, chrysene, perylene, coronene, terrylene, ovalene, quaterrylene, and circumanthracene; (18) derivatives obtained by substituting at least one of carbons in the acenes with such an atom as nitrogen (N), sulfur (S) or oxygen (O) or with such a functional group as carbonyl group, for example, triphenodioxazine, triphenodithiazine or hexacene-6,15-quinone; (19) polymeric materials and polycyclic condensates, such as polyvinylcarbazole, polyphenylene sulfide or polyvinylene sulfide; (20) oligomers having the same repeating units as those in the above-mentioned polymeric materials; (21) metal phthalocyanines such as copper phthalocyanine; (22) tetrathiafulvalene; (23) tetrathiapentalene; (24) N,N'-bis(1H,1H-perfluorooctyl), N,N'-bis(1H,1H-perfluorobutyl) or N,N'-dioctylnaphthalene-1,4,5,8-tetracarboxylic acid diimide derivative together with naphthalene 1,4,5,8-tetracarboxylic acid diimide and N,N'-bis(4-trifluoromethylbenzyl)naphthalene 1,4,5,8-tetracarboxylic acid diimide; (25) naphthalenetetracarboxylic acid diimides such as naphthalene 2,3,6,7-tetracarboxylic acid diimide; (26) condensed ring tetracarboxylic acid diimides represented by anthracenetetracarboxylic acid diimide such as anthracene 2,3,6,7-tetracarboxylic acid diimide; (27) fullerenes such as $C_{60}$, $C_{70}$, $C_{76}$, $C_{78}$ or $C_{84}$; (28) carbon nanotubes such as single-walled carbon nanotube (SWNT); (29) dyes such as merocyanine dye or hemicyanine dye; and (30) peri-xanthenoxanthene compounds such as 2,9-dinaphthyl-peri-xanthenoxanthene.

The organic semiconductor material is not restricted to the above-mentioned ones but may be derivatives of the above-mentioned series of materials. The derivatives are materials obtained by introducing at least one substituent group into the above-mentioned materials, the kinds and introduction positions of the substituent groups being arbitrary.

The organic conductive layers 5 and 6 are for enhancing charge injection efficiency between the organic semiconductor layer 4 and each of the source electrode 7 and the drain electrode 8, and are, for example, hole injection layers or the like. The organic conductive layer 5 is inserted between the organic semiconductor layer 4 and the source electrode 7, in the region where the organic semiconductor layer 4 and the source electrode 7 overlap with each other. On the other hand, the organic conductive layer 6 is inserted between the organic semiconductor layer 4 and the drain electrode 8, in the region where the organic semiconductor layer 4 and the drain electrode 8 overlap with each other. This is because the organic conductive layers 5 and 6 are formed by a method in which, as will be described later, an organic conductive layer 9 (FIG. 2) is formed so as to cover the surface of the organic semiconductor layer 4 and thereafter the organic conductive layer 9 is selectively etched, with the source electrode 7 and the drain electrode 8 as a mask. Therefore, the organic conductive layers 5 and 6 are spaced apart from each other.

Unlike the organic semiconductor layer 4, the organic conductive layers 5 and 6 each include a material (non-metal-containing material) not containing as a constituent element at least one of a metallic element and a semi-metallic element which are capable of reacting with an etching gas. The non-metal-containing material is a material which, when etched by a dry etching method using an arbitrary etching gas in a manufacturing process of the organic TFT, is incapable of forming the above-mentioned reaction product. Therefore, the organic conductive layer 9 (FIG. 2) does not function as an etching stopper, and is etched into a desired pattern shape. Accordingly, when the organic conductive layer 9 is dry etched by use of the etching gas, a selectivity ratio is obtained between the organic conductive layer 9 and the organic semiconductor layer 4.

The organic conductive layers 5 and 6 preferably have a work function approximate to the ionization potential of the organic semiconductor layer 4, in order to enhance the charge injection efficiency between the organic semiconductor layer 4 and each of the source electrode 7 and the drain electrode 8. The non-metal-containing material having such a property is, for example, at least one selected from among conductive polymers, conductive polymers doped with an arbitrary acceptor or the like, conductive organic conductors, and carbon materials. Examples of the conductive polymers include such copolymers as PEDOT-PSS, etc. and polyaniline. Examples of the conductive polymers doped with an arbitrary acceptor or the like include polythiophene doped with oxygen. Examples of the conductive organic conductors include tetrathiafulvalene-7,7,8,8-tetracyanoquinodimethane (TTF-TCNQ). Examples of the carbon materials include carbon nanotubes.

Incidentally, in the case where the etching gas contains oxygen and where the metal-containing material contains silicon as a constituent element, as above-mentioned, the non-metal-containing material preferably does not contain silicon as a constituent element. This is for securing the above-mentioned selectivity ratio.

The source electrode 7 and the drain electrode 8 are provided respectively on the organic conductive layers 5 and 6 in such a manner as to be spaced part from each other, and include, for example, a material similar to the material of the gate electrode 2. Each of the source electrode 7 and the drain electrode 8 is preferably so disposed as to overlap with the gate electrode 2, at least at part thereof.

Incidentally, sign P1 in FIG. 1 denotes a current path in the organic TFT. In this organic TFT, the source electrode 7 is connected to the organic semiconductor layer 4 through the organic conductive layer 5, and the drain electrode 8 is connected to the organic semiconductor layer 4 through the organic conductive layer 6. Therefore, an electric current flows from the source electrode 7 through the organic conductive layer 5 into the organic semiconductor layer 4 and then flows through the organic conductive layer 6 to the drain electrode 8, along the path P1.

<2. Method of Manufacturing Thin Film Transistor>

Figure 2:
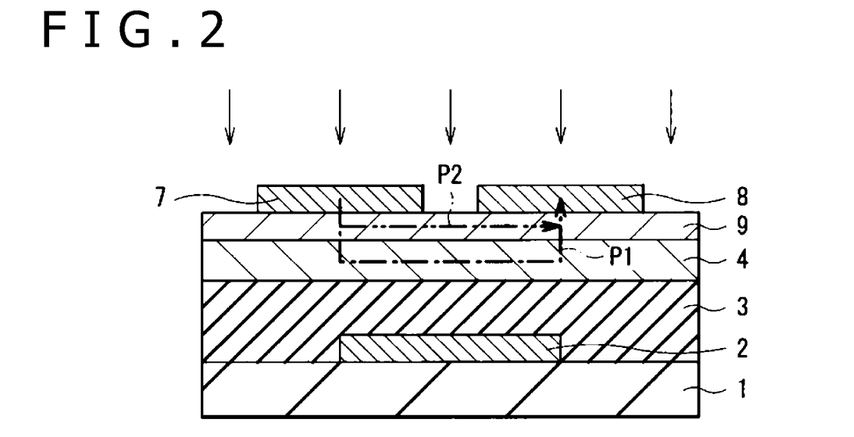
FIG. 2 is a sectional view for illustrating a method of manufacturing a thin film transistor.
Figure 3:
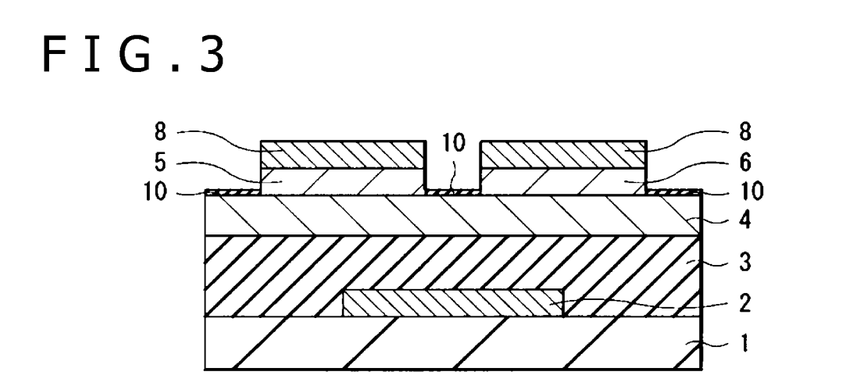
FIG. 3 is a sectional view for illustrating a step subsequent to the step of FIG. 2.

Now, a method of manufacturing the above-described thin film transistor will be described below. FIGS. 2 and 3 are drawings for illustrating a method of manufacturing an organic TFT as the thin film transistor, and each show a sectional configuration corresponding to FIG. 1. Since the materials for forming the structural components of the organic TFT have been described in detail above, respective examples of the materials will be mentioned in the following description.

In manufacturing the organic TFT, first, a gate electrode 2 is formed on a support substrate 1 such as a plastic film, as shown in FIG. 2. In this case, for example, a metallic material layer (not shown) is formed so as to cover a surface of the support substrate 1, followed by patterning of the metallic material layer.

The material forming the metallic material layer is, for example, copper or the like. The method of forming the metallic material layer is, for example, a vapor phase growth method such as sputtering method, vapor deposition method or chemical vapor deposition (CVD) method. The method of patterning the metallic material layer is, for example, an etching method or the like. The etching method may be a dry etching method such as ion milling method or reactive ion etching (RIE) method, or may be a wet etching method.

Incidentally, in patterning the metallic material layer, a photolithographic method or an ultraviolet drawing method or the like may be used jointly. In this case, for example, the surface of the metallic material layer is coated with a photoresist to form a photoresist film, then the photoresist film is patterned by a photolithographic method or the like, and thereafter the metallic material layer is etched using the patterned photoresist film as a mask. It is to be noted here that a metallic film or the like may be used in place of the photoresist film as a mask.

Next, a gate insulating layer 3 is formed so as to cover at least the gate electrode 2. The material for forming the gate insulating layer 3 is, for example, PVP or the like. Besides, the method for forming the gate insulating layer 3 is, for example, a coating method such as spin coating method.

Subsequently, an organic semiconductor layer 4 is formed on the gate insulating layer 3 so as to cover the surface of the gate insulating layer 3. The material for forming the organic semiconductor layer 4 is, for example, TES-anthradithiophene or TIPS-pentacene, which is a metal-containing material. Besides, the method for forming the organic semiconductor layer 4 is, for example, (1) a vapor phase growth method such as resistance heating vapor deposition method, sputtering, vapor deposition method or CVD method, or (2) a coating method such as spin coating method, air doctor coater method, blade coater method, rod coater method, knife coater method, squeeze coater method, reverse roll coater method, transfer roll coater method, gravure coater method, kiss coater method, cast coater method, spray coater method, slit orifice coater method, calendar coater method or dipping method. These forming methods can be appropriately selected according to such conditions as the material for forming the organic semiconductor layer 4. Incidentally, the thickness of the organic semiconductor layer 4 is not particularly limited, and may be, for example, 50 nm.

Then, an organic conductive layer 9 is formed on the organic semiconductor layer 4 so as to cover the organic semiconductor layer 4. The organic conductive layer 9 is a preparatory layer for formation of organic conductive layers 5 and 6. The material for forming the organic conductive layer 9 is similar to the material (non-metal-containing material) for forming the organic conductive layers 5 and 6. Thus, the material for forming the organic conductive layer 9 is, for example, TTF-TCNQ, which is a conductive organic conductor. In addition, the method for forming the organic conductive layer 9 is, for example, similar to the methods for forming the organic semiconductor layer 4. These methods can be appropriately selected according to such conditions as the material for forming the organic conductive layer 9. Incidentally, the thickness of the organic conductive layer 9 is not particularly limited, and may be, for example, 5 nm.

Subsequently, a source electrode 7 and a drain electrode 8 spaced apart from each other are formed on the organic conductive layer 9. In this case, for example, a metallic material layer (not shown) is formed so as to cover the surface of the organic conductive layer 9, followed by patterning the metallic material layer.

The material for forming the metallic material layer is, for example, gold or the like. Besides, the method for forming the metallic material layer is, for example, a vapor phase growth method such as sputtering method, vapor deposition method or chemical vapor deposition (CVD) method. The method for patterning the metallic material layer is, for example, an etching method or the like. The etching method may be a dry etching method such as ion milling method or reactive ion etching (RIE) method, or may be a wet etching method. Among the methods for patterning, a wet etching method is preferred, from the viewpoint of low possibility of damaging the organic semiconductor layer 4 or the organic conductive layer 9. Incidentally, the thickness of each of the source electrode 7 and the drain electrode 8 is not specifically limited, and may be, for example, 50 nm.

Here, if necessary, the organic semiconductor layer 4 and the organic conductive layer 9 may be patterned, before formation of the source electrode 7 and the drain electrode 8. In this case, a process may be adopted in which a photoresist film or the like is formed on the organic conductive layer 9 by use of a photolithographic method or the like, followed by patterning the organic semiconductor layer 4 and the organic conductive layer 9 by using the photoresist film or the like as a mask. The method for patterning in this case is, for example, a dry etching method in which an active gas such as carbon tetrafluoride ($CF_4$) is used as an etching gas.

Finally, using the source electrode 7 and the drain electrode 8 as a mask, the organic conductive layer 9 is etched to selectively remove the organic conductive layer 9, thereby forming the organic conductive layers 5 and 6, as shown in FIG. 3. The method for this etching is, for example, a dry etching method in which an active gas such as oxygen gas is used as an etching gas.

In this etching step, when the etching treatment reaches the organic semiconductor layer 4 after the organic conductive layer 9 is etched, the metallic element or the like in the metal-containing material reacts with an ingredient or ingredients of the etching gas, so that a reaction product 10 is produced. For example, in the case where the etching gas is oxygen gas and where the metal-containing material is TES-anthradithiophene or TIPS-pentacene or the like which has a silylalkyl group, the reaction product 10 is silicon oxide.

When the reaction product 10 is produced on the surface of the organic semiconductor layer 4, the reaction product 10 functions as an etching stopper layer. Therefore, the rate of etching is rapidly lowered, and the etching treatment is substantially finished. This ensures that a selectivity ratio is obtained at the time of etching. Accordingly, while the organic conductive layer 9 is thoroughly etched (patterned) so as to form the organic conductive layers 5 and 6, the organic semiconductor layer 4 is little etched and is left. Consequently, in the regions where the organic semiconductor layer 4 overlaps with the source electrode 7 and the drain electrode 8, the organic conductive layers 5 and 6 are formed in the manner of being inserted between the organic semiconductor layer 4 and the relevant electrodes.

Incidentally, after the formation of the organic conductive layers 5 and 6, the reaction product 10 may be left or may be removed. Where the reaction product 10 is an insulating oxide or the like, it does not influence the performance of the organic TFT, and, therefore, does not matter if left as it is. In the case of removing the reaction product 10, for example, a wet etching method or the like may be used. In FIG. 1, the reaction product 10 is now shown.

As a result of the foregoing, the organic semiconductor layer 4, the organic conductive layers 5 and 6, the source electrode 7 and the drain electrode 8 are interconnected so that the current path P1 shown in FIG. 1 is obtained, and, accordingly, a top-contact bottom-gate type organic TFT is completed.

[Operation and Effect Concerning the Method of Manufacturing Thin Film Transistor]

In the organic TFT as a thin film transistor and in the method of manufacturing the same, in the regions where the organic semiconductor layer 4 overlaps with the source electrode 7 and the drain electrode 8, the organic conductive layers 5 and 6 are inserted between the organic semiconductor layer 4 and the relevant electrodes. The organic semiconductor layer 4 is formed from the metal-containing material containing at least one of the metallic element and the semi-metallic element which are capable of reacting with the etching gas. On the other hand, the organic conductive layers 5 and 6 are formed from the non-metal-containing material not containing at least one of the metallic element and the semi-metallic element which are capable of reacting with the etching gas. Therefore, an enhanced charge injection efficiency between the organic semiconductor layer 4 and each of the source electrode 7 and the drain electrode 8 and good performance of the organic TFT can both be realized.

Figure 4:
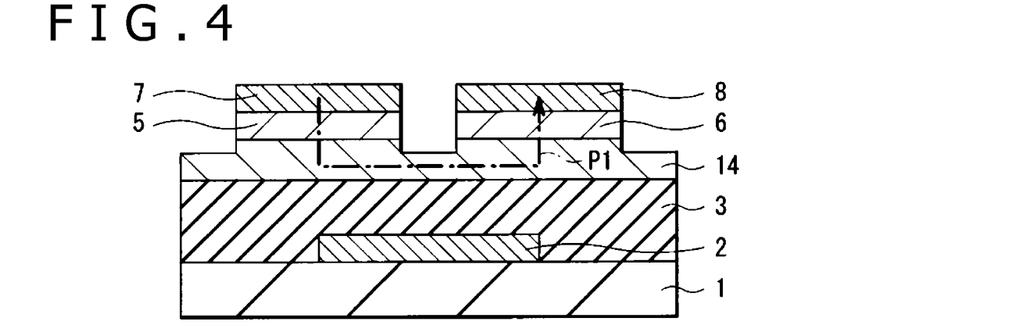
FIG. 4 is a sectional view illustrating the configuration of a thin film transistor according to a comparative example.

FIG. 4 is a drawing for illustrating the configuration and manufacturing method of an organic TFT according to a comparative example, and shows a sectional configuration corresponding to FIG. 1. The organic TFT according to the comparative example is the same in configuration as the organic TFT according to the present embodiment, except that an organic semiconductor layer 14 formed from a non-metal-containing material is provided in place of the organic semiconductor layer 4 formed from the metal-containing material.

In the first place, there is a technical assumption that, if the organic conductive layer 9 is inserted between the organic semiconductor layer 4 and each of the source electrode 7 and the drain electrode 8 (FIG. 2), the presence of the organic conductive layer 9 causes a leakage current to be generated between the electrodes, resulting in a lowering in the performance of the organic TFT. This is because a structure in which the organic conductive layer 9 is formed on the organic semiconductor layer 4 to extend over the region ranging from the region of the source electrode 7 to the region of the drain electrode 8 results in the flow of an unnecessary current along a path P2, in addition to the flow of a normal current along the path P1. In order to solve the problem arising from the leakage current, therefore, patterning of the organic conductive layer 9 is investigated.

In the comparative example (FIG. 4) in which the organic semiconductor layer 14 is formed of a non-metal-containing material, however, the organic semiconductor layer 14 cannot function as an etching stopper at the time of etching. Accordingly, the organic semiconductor layer 14 is liable to be etched similarly to the organic conductive layer 9; in other words, a selectivity ratio cannot be obtained, so that the progress of the etching treatment cannot be controlled. In this case, even if an attempt to etch only the organic conductive layer 9 is made, the etching treatment would proceed excessively and the organic semiconductor layer 14 would also be etched, resulting in narrowing of the current path P1. Consequently, although the charge injection efficiency between the organic semiconductor layer 14 and each of the source electrode 7 and the drain electrode 8 is enhanced by the organic conductive layers 5 and 6, the performance of the organic TFT would be lowered due to the constriction (narrowing) of the current path P1.

On the other hand, in the present embodiment (FIG. 1) in which the organic semiconductor layer 4 is formed of the metal-containing material, the organic semiconductor layer 4 functioning as an etching stopper offers a selectivity ratio, so that the extent of progress of the etching treatment can be controlled by utilizing the selectivity ratio. In this case, only the organic conductive layer 9 is etched, while the organic semiconductor layer 4 is little etched and is left substantially intact; therefore, the charge injection efficiency is enhanced by the organic conductive layers 5 and 6, and the performance of the organic TFT is maintained because the current path P1 is secured. Consequently, an enhanced charge injection efficiency and securing of the current path P1 can both be attained.

<3. Modifications>

In FIG. 1, the organic TFT is provided simply with the organic semiconductor layer 4 which is adjacent to the organic conductive layers 5 and 6 and which is formed of the metal-containing layer. However, other configuration may also be adopted. For example, a configuration may be adopted in which at least one additional organic semiconductor layer is provided between the gate insulating layer 3 and the organic semiconductor layer 4.

The organic semiconductor layer 4 has to be formed of the metal-containing material, in order to function as the etching stopper, as above-mentioned. On the other hand, the additional organic semiconductor layer is not required to function as an etching stopper; therefore, the additional organic semiconductor layer may be formed of a metal-containing material or may be formed of a non-metal-containing material. The material for forming the additional organic semiconductor layer (a metal-containing material or a non-metal-containing material) may be similar to the materials for forming the organic semiconductor layer 4 and the organic conductive layers 5 and 6.

Figure 5:
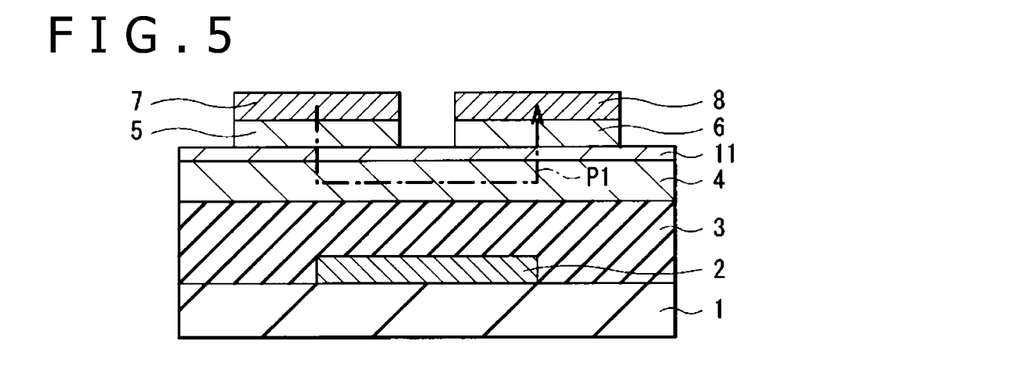
FIG. 5 is a sectional view illustrating a modification as to the configuration of a thin film transistor.

Specifically, for example, as shown in FIG. 5, the organic TFT may include one additional organic semiconductor layer 11. The material for forming the additional organic semiconductor layer 11 is, for example, a non-metal-containing material, a specific example of which is a peri-xanthenoxanthene compound such as 2,9-dinaphthyl-peri-xanthenoxanthene. In addition, the material for forming the organic semiconductor layer 4 is the metal-containing material such as, for example, TES-anthradithiophene. The thicknesses of the organic semiconductor layer 4 and the additional organic semiconductor layer 11 are not particularly limited, and may be, for example, 20 nm and 30 nm, respectively. In this case, also, the same operation and effect as those in the case where the additional organic semiconductor layer is not provided (FIG. 1) can be obtained. Naturally, the number of the additional organic semiconductor layer(s) is not limited to one but may be two or more.

Incidentally, in the case where the material forming the additional organic semiconductor layer 11 is a metal-containing material, the material forming the organic semiconductor layer 4 and the material forming the additional organic semiconductor layer 11 may be the same or different from each other. The thicknesses of these layers may also be the same or different. It is to be noted here, however, that in order to realize a structure in which the additional organic semiconductor layer 11 formed of a non-metal-containing material rather than the organic semiconductor layer 4 formed of the metal-containing material is to form a main current path P1, it is preferable to set the thickness of the organic semiconductor layer 4 smaller than the thickness of the additional organic semiconductor layer 11. This is because the thickness of the additional organic semiconductor layer 11 should be sufficiently large in order to secure the current path P1 but, on the other hand, the thickness of the organic semiconductor layer 4 is required only to be sufficient for the function as the etching stopper.

Figure 6:
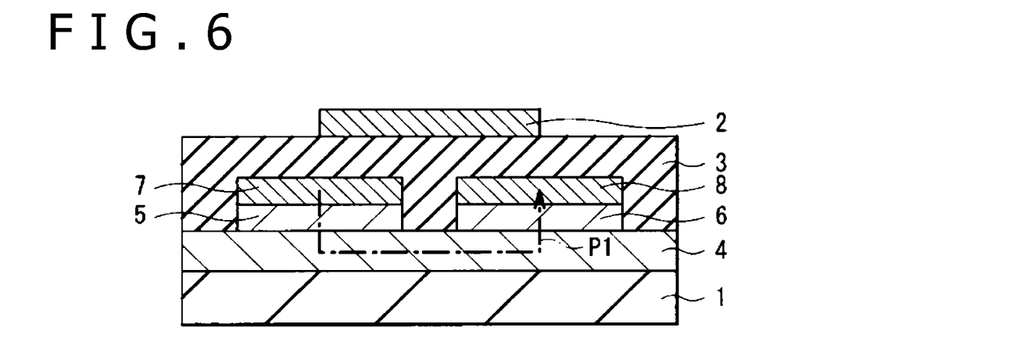
FIG. 6 is a sectional view illustrating another modification as to the configuration of a thin film transistor.

In addition, while the organic TFT is of the top-contact bottom-gate type in FIG. 1, the organic TFT may be of a top-contact top-gate type, as shown in FIG. 6. In this organic TFT, for example, an organic semiconductor layer 4, organic conductive layers 5 and 6, a source electrode 7 and a drain electrode 8, a gate insulating layer 3, and a gate electrode 2 are stacked in this order over a support substrate 1. The detailed configuration and manufacturing method of this organic TFT are the same as those in the present embodiment, except for the difference in the order in which the structural components are stacked, as above-mentioned. In this case, also, the same operation as that in the case of the top-contact bottom-gate type (FIG. 1) can be obtained, and, accordingly, the same effect as that in the case of the top-contact bottom-gate type (FIG. 1) can be obtained.

<4. Application Examples (Electronic Apparatuses) of Thin Film Transistor>

Now, application examples of the organic TFT described above as the thin film transistor will be described below. The organic TFT is applicable, for example, to a number of electronic apparatuses, as will be described below.

<4-1. Liquid Crystal Display>

Figure 7:
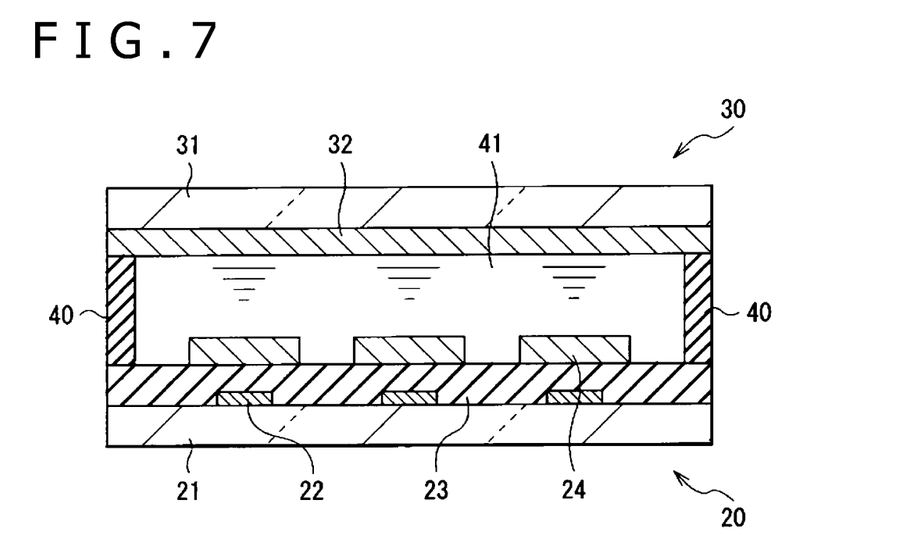
FIG. 7 is a sectional view illustrating the configuration of a liquid crystal display as an example of application of the thin film transistor.
Figure 8:
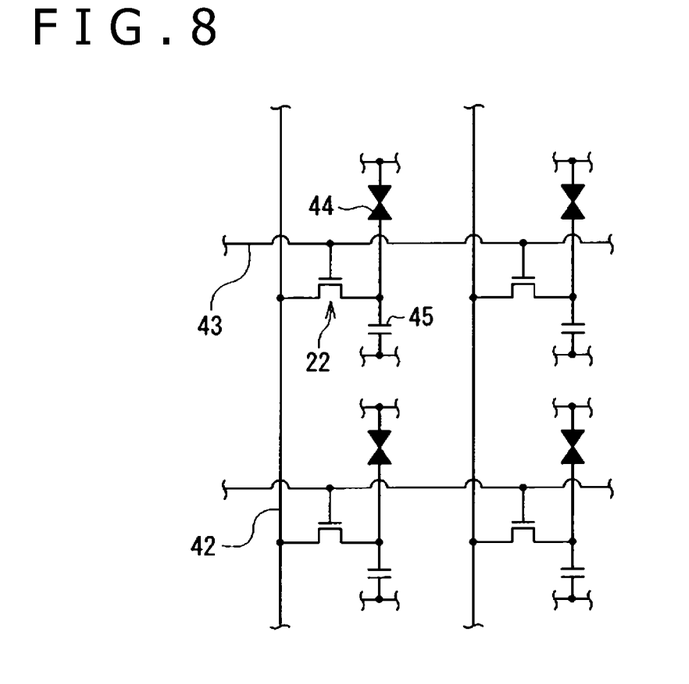
FIG. 8 is a circuit diagram for the liquid crystal display shown in FIG. 7.

The organic TFT is applied, for example, to a liquid crystal display. FIGS. 7 and 8 respectively show a sectional configuration and a circuit configuration of a liquid crystal display. The apparatus configuration (FIG. 7) and the circuit configuration (FIG. 8) described below are merely examples, and, therefore, these configurations can be modified, as required.

The liquid crystal display to be described here is, for example, a transmission type liquid crystal display of an active matrix driving system using the organic TFTs, wherein the organic TFTs are used as elements for switching (pixel selection). As shown in FIG. 7, the liquid crystal display includes a liquid crystal layer 41 sealedly sandwiched between a driving substrate 20 and a counter substrate 30.

The driving substrate 20 has, for example, a structure in which organic TFTs 22, a flattening insulating layer 23 and pixel electrodes 24 are stacked in this order over a surface of a support substrate 21, wherein the organic TFTs 22 and the pixel electrodes 24 are arranged in a matrix pattern. It is to be noted here that the number of the organic TFT or TFTs 22 included in one pixel may be one or may be two or more. FIGS. 7 and 8 show an exemplary case in which one organic TFT 22 is included in each pixel.

The support substrate 21 is formed, for example, from a light-transmitting material such as glass or plastic material, and the organic TFT 22 has the same configuration as that of the above-described organic TFT. The kind of the plastic material is, for example, the same as described in connection with the organic TFT above, which applies also in the following description. The flattening insulating layer 23 is formed, for example, from an insulating resin material such as polyimide. The pixel electrodes 24 are formed, for example, from a light-transmitting conductive material such as ITO. Incidentally, the pixel electrodes 24 are each connected to the organic TFT 22 through a contact hole (not shown) provided in the flattening insulating layer 23.

The counter substrate 30 is, for example, a substrate having a counter electrode 32 formed over the whole area of a surface of a support substrate 31. The support substrate 31 is formed, for example, from a light-transmitting material such as glass or plastic material. The counter electrode 32 is formed, for example, from a light-transmitting conductive material such as ITO.

The driving substrate 20 and the counter substrate 30 are disposed so that the pixel electrodes 24 and the counter electrode 32 face each other, with the liquid crystal layer 41 therebetween, and these substrates are adhered to each other with a sealing material 40. The kind of liquid crystal molecules contained in the liquid crystal layer 41 can be selected arbitrarily.

In addition to the above-mentioned structural components, the liquid crystal display may include other structural components such as a phase plate, a polarizing plate, alignment films and a backlight unit (all not shown).

As for example shown in FIG. 8, a circuit for driving the liquid crystal display includes capacitors 45, together with the organic TFTs 22 and liquid crystal display elements 44 (element parts each of which includes the pixel electrode 24, the counter electrode 32 and the liquid crystal layer 41). In this circuit, a plurality of signal lines 42 are arrayed in a row direction, while a plurality of scanning lines 43 are arrayed in a column direction; besides, the organic TFT 22, the liquid crystal display element 44 and the capacitor 45 are arranged at each of the positions where the signal lines 42 and the scanning lines 43 intersect. The parts to which the source electrode, the gate electrode and the drain electrode in the organic TFT 22 are connected are not restricted to those in a mode shown in FIG. 8, and can be modified arbitrarily. The signal lines 42 and the scanning lines 43 are connected respectively to a signal line driving circuit (data driver) and a scanning line driving circuit (scanning driver), which are not shown.

In the liquid crystal display, when the liquid crystal display element 44 is selected by the organic TFT 22 and an electric field is applied between the pixel electrode 24 and the counter electrode 32 of the selected display element, the aligned state of the liquid crystal molecules in the liquid crystal layer 41 is changed according to the intensity of the electric field. As a result, the amount of light transmitted (transmittance) is controlled according to the aligned state of the liquid crystal molecules. In this manner, a gradation image is displayed.

According to this liquid crystal display, in which the organic TFT 22 has the same configuration as that of the above-described organic TFT, an enhanced charge injection efficiency between the organic semiconductor layer and the source and drain electrodes and good performance of the organic TFTs 22 can both be achieved. Therefore, display performance can be enhanced. Incidentally, the liquid crystal display may not necessarily be of the transmission type, and may be of a reflection type.

<4-2. Organic EL Display>

Figure 9:
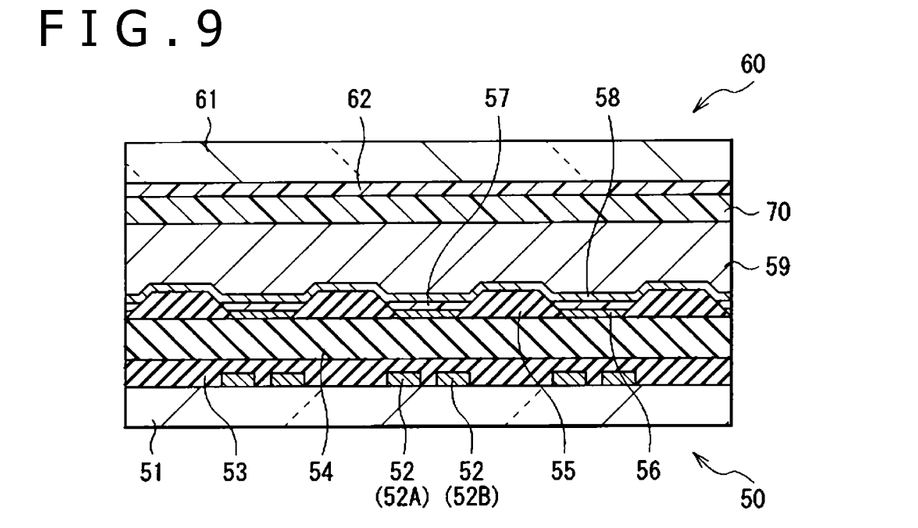
FIG. 9 is a sectional view illustrating the configuration of an organic electroluminescence (EL) display as an example of application of the thin film transistor.
Figure 10:
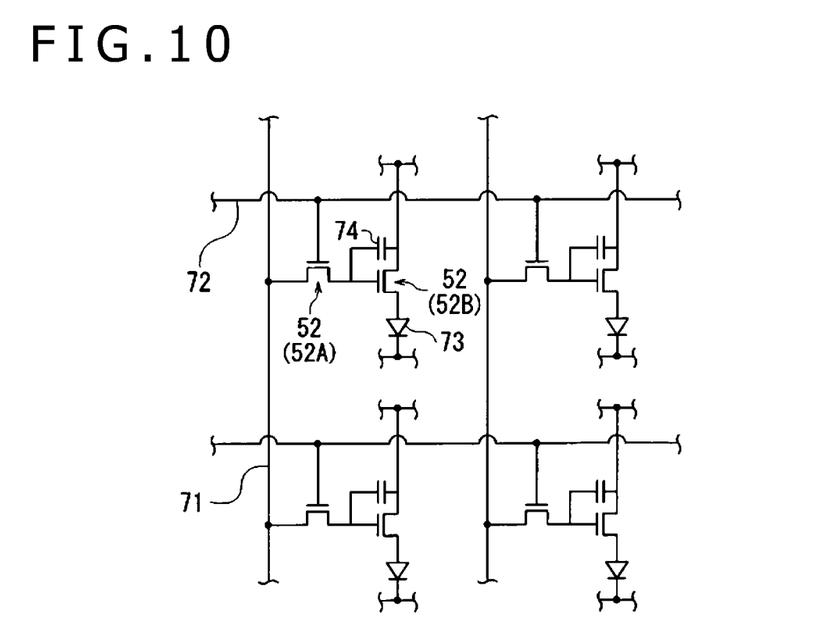
FIG. 10 is a circuit diagram for the organic EL display shown in FIG. 9.

The organic TFT is applied, for example, to an organic EL display. FIGS. 9 and 10 respectively show a sectional configuration and a circuit configuration of an organic EL display. The apparatus configuration (FIG. 9) and the circuit configuration (FIG. 10) described below are merely examples, and, therefore, these configurations can be modified, as required.

The organic EL display to be described here is, for example, an organic EL display of an active matrix driving system in which the organic TFTs are used as switching elements. The organic EL display includes a driving substrate 50 and a counter substrate 60 adhered to each other through an adhesive layer 70, and is, for example, of a top emission type in which light is emitted through the counter substrate 60.

The driving substrate 50 has, for example, a structure in which organic TFTs 52, a protective layer 53, a flattening insulating layer 54, a pixel separating insulating layer 55, pixel electrodes 56, organic layers 57, a counter electrode 58 and a protective layer 59 are stacked in this order over a surface of a support substrate 51. The organic TFTs 52, the pixel electrodes 56 and the organic layers 57 are arranged in a matrix pattern. It should be noted here that the number of the organic TFT or TFTs 52 included in one pixel may be one or may be two or more. FIGS. 9 and 10 show an exemplary case in which two organic TFTs 52 (a selecting TFT 52A and a driving TFT 52B) are included in each pixel.

The support substrate 51 is formed, for example, of a glass or plastic material or the like. Since light is emitted through the counter substrate 60 in the top emission type, the support substrate 51 may be formed of a light-transmitting material or may be formed of a non-light-transmitting material. The organic TFT 52 has the same configuration as that of the above-described organic TFT. The protective layer 53 is formed, for example, of a polymeric material such as PVA or polyparaxylylene. The flattening insulating layer 54 and the pixel separating insulating layer 55 are each formed, for example, from an insulating resin material such as polyimide. The pixel separating insulating layer 55 is preferably formed from a photosensitive resin material which can be molded (shaped) by photo-patterning or reflow or the like, for the purpose of, for example, simplifying the formation of the layer and enabling the layer to be formed into a desired shape. Incidentally, if sufficient flatness is offered by the protective layer 53, the flattening insulating layer 54 may be omitted.

The pixel electrodes 56 are formed, for example, of a reflective material such as aluminum, silver, titanium or chromium. The counter electrode 58 is formed, for example, of a light-transmitting conductive material such as ITO or IZO. It is to be noted here that the counter electrode 58 may be formed of a light-transmitting metallic material such as calcium (Ca) or a light-transmitting organic conductive material such as PEDOT. The organic layers 57 include, for example, a light-emitting layer which generates red, green or blue or other-colored light; if necessary, the organic layers 57 may have a stacked structure including a hole transport layer and an electron transport layer or the like. The material for forming the light-emitting layer can be arbitrarily selected according to the color of the light to be generated. The pixel electrodes 56 and the organic layers 57 are arranged in a matrix pattern while being separated by the pixel separating insulating layer 55. On the other hand, the counter electrode 58 extends continuously so as to range over each of the pixels while facing the pixel electrode 56 through the organic layer 57. The protective layer 59 is formed, for example, of a light-transmitting dielectric material such as silicon oxide, aluminum oxide, silicon nitride, polyparaxylylene or urethane. Incidentally, the pixel electrodes 56 are each connected to the organic TFT 52 through a contact hole (not shown) provided in the protective layer 53 and the flattening insulating layer 54.

The counter substrate 60 has, for example, a color filter 62 provided on a surface of a support substrate 61. The support substrate 61 is formed, for example, of a light-transmitting material such as glass or plastic material. The color filter 62 has a plurality of color regions corresponding to the colors of lights generated in the organic layers 57. It is to be noted here, however, that the color filter 62 may be omitted.

The adhesive layer 70 is formed of an adhesive such as a thermosetting resin.

As for example shown in FIG. 10, a circuit for driving the organic EL display includes capacitors 74, together with the organic TFTs 52 (the selecting TFTs 52A and the driving TFTs 52B) and organic EL display elements 73 (element parts each of which includes the pixel electrode 56, the organic layer 57 and the counter electrode 58). In this circuit, the organic TFT 52, the organic EL display element 73 and the capacitor 74 are arranged at each of the positions where a plurality of signal lines 71 and a plurality of scanning lines 72 intersect. The parts to which the source electrode, the gate electrode and the drain electrode in each of the selecting TFT 52A and the driving TFT 52B are connected are not restricted to those in a mode shown in FIG. 10, and can be modified arbitrarily.

For example when the organic EL display element 73 is selected by the selecting TFT 52A in this organic EL display, the organic EL display element 73 is driven by the driving TFT 52B. As a result, an electric field is applied between the pixel electrode 56 and the counter electrode 58, whereon light is generated in the organic layer 57. In this case, for example, red, green and blue lights are generated respectively in three organic EL display elements 73 which are arranged adjacent to one another. Composite light synthesized from these lights is emitted through the counter substrate 60 to the exterior. In this manner, a gradation image is displayed.

According to this organic EL display, in which the organic TFT 52 has the same configuration as that of the above-described organic TFT, display performance can be enhanced in the same manner as in the case of the liquid crystal display described above.

Incidentally, the organic EL display is not restricted to the top emission type. The organic EL display may be of a bottom emission type in which light is emitted through the driving substrate 50, or may be of a dual emission type in which light is emitted through both the driving substrate 50 and the counter substrate 60. In this case, of the pixel electrode 56 and the counter electrode 58, the electrode on the side on which light is emitted is formed of a light-transmitting material, while the electrode on the side on which light is not emitted is formed of a reflective material.

<4-3. Electronic Paper Display>

Figure 11:
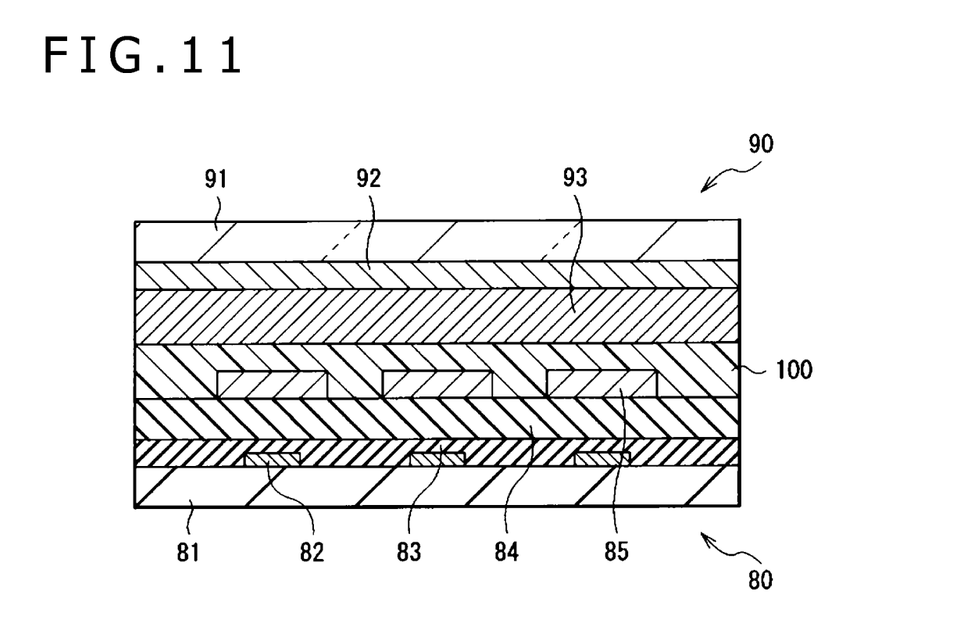
FIG. 11 is a sectional view illustrating the configuration of an electronic paper display as an example of application of the thin film transistor.

The organic TFT is applied, for example, to an electronic paper display. FIG. 11 shows a sectional configuration of an electronic paper display. The apparatus configuration (FIG. 11) described below and the circuit configuration to be described referring to FIG. 8 are merely examples, and, therefore, these configurations can be modified, as required.

The electronic paper display to be described here is, for example, an electronic paper display of an active matrix driving system in which the organic TFTs are used as switching elements. The electronic paper display has, for example, a structure in which a driving substrate 80 and a counter substrate 90 which includes an electrophoresis element 93 are adhered to each other through an adhesive layer 100.

The driving substrate 80 has, for example, a configuration in which organic TFTs 82, a protective layer 83, a flattening insulating layer 84 and pixel electrodes 85 are stacked in this order over a surface of a support substrate 81, wherein the organic TFTs 82 and the pixel electrodes 85 are arranged in a matrix pattern. The support substrate 81 is formed, for example, of a glass or plastic material or the like, and the organic TFT 82 has the same configuration as that of the above-described organic TFT. The protective layer 83 and the flattening insulating layer 84 are each formed, for example, of an insulating resin material such as polyimide. The pixel electrodes 85 are formed of a metallic material such as silver, for example. Incidentally, the pixel electrodes 85 are each connected to the organic TFT 82 through a contact hole (not shown) provided in the protective layer 83 and the flattening insulating layer 84. If sufficient flatness is offered by the protective layer 83, the flattening insulating layer 84 may be omitted.

The counter substrate 90 has, for example, a structure in which a counter electrode 92 and the electrophoresis element 93 are stacked in this order over a surface of a support substrate 91, wherein the counter electrode 92 is formed over the whole area of the surface. The support substrate 91 is formed, for example, of a light-transmitting material such as glass or plastic material. The counter electrode 92 is formed, for example, of a light-transmitting conductive material such as ITO. The electrophoresis element 93 is an element in which contrast is generated by utilizing a phenomenon of electrophoresis, and its configuration is arbitrary.

In addition to the above-mentioned structural components, the electronic paper display may include other structural components such as a color filter (not shown).

A circuit for driving the electronic paper display has, for example, a configuration similar to that of the circuit for the liquid crystal display shown in FIG. 8. The circuit for the electronic paper display includes the organic TFTs 82 and electronic paper display elements (element parts each of which includes the pixel electrode 85, the counter electrode 92 and the electrophoresis element 93), in place of the organic TFTs 22 and the liquid crystal display elements 44, respectively.

In this electronic paper display, when the electronic paper display element is selected by the organic TFT 82 and an electric field is applied between the pixel electrode 85 and the counter electrode 92 of the selected display element, a contrast is generated in the electrophoresis element 93 according to the electric field. In this manner, a gradation image is displayed.

According to the electronic paper display, in which the organic TFT 82 has the same configuration as that of the above-described organic TFT, display performance can be enhanced in the same manner as in the case of the liquid crystal display described above.

While the present application has been described by showing the embodiments above, the present application is not restricted to the embodiments, and various modifications are possible. For instance, the electronic apparatuses to which the thin film transistor according to an embodiment of the present application is applied are not restricted to liquid crystal displays, organic EL displays and electronic paper displays, but may be other displays. Examples of the other displays include MEMS (Micro Electro Mechanical Systems) display units (MEMS displays). In this case, also, display performance can be enhanced.

Furthermore, the thin film transistor according to an embodiment of the present application may be applied to other electronic apparatuses than displays. Examples of the other electronic apparatuses include sensor matrixes, memory sensors, RFID (Radio Frequency Identification) tags, and sensor arrays. In this case, also, enhanced performance can be promised.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A thin film transistor comprising:
   an organic semiconductor layer including at least one of a metallic element and a semi-metallic element capable of reacting with an etching gas;
   an organic conductive layer disposed on portions of a surface of the organic semiconductor layer, wherein the organic conductive layer does not contain the at least one of the metallic element and the semi-metallic element capable of reacting with the etching gas;
   a source electrode disposed on a first portion of the organic conductive layer;
   a drain electrode disposed on a second portion of the organic conductive layer,
   wherein,
      the first and second portions of the organic conductive layer are spaced apart from each other forming a void area between the spaced apart first and second portions of the organic conductive layer, the source electrode and the drain electrode are spaced apart from each other, and the organic conductive layer is sandwiched between the organic semiconductor layer and the source and drain electrodes; and an etching stopper layer, wherein, the etching stopper layer is disposed on portions of the organic semiconductor layer not covered by the organic conductive layer within the void area, the etching stopper layer is disposed on portions of the organic semiconductor layer not covered by the organic conductive layer outside of the void area, and the etching stopper layer includes a reaction product of the organic semiconductor layer and the etching gas.

2. The thin film transistor according to claim 1, wherein the etching gas contains one active gas selected from among oxygen ($O_2$) and halogens, and wherein the metallic element and the semi-metallic element are one selected from the group consisting of beryllium (Be), magnesium (Mg), aluminum (Al), calcium (Ca), scandium (Sc), titanium (Ti), vanadium (Va), chromium (Cr), manganese (Mn), iron (Fe), cobalt (Co), nickel (Ni), copper (Cu), zinc (Zn), gallium (Ga), strontium (Sr), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), tin (Sn), barium (Ba), hafnium (Rf), tantalum (Ta), tungsten (W), rhenium (Re), osmium (Os), iridium (Ir), platinum (Pt), gold (Au), mercury (Rg), thallium (Tl), lead (Pb), bismuth (Bi), polonium (Po), boron (B), silicon (Si), germanium (Ge), arsenic (As), antimony (Sb) and tellurium (Te).

3. The thin film transistor according to claim 1, wherein the organic semiconductor layer includes a metal-containing material that is an organic semiconductor material which includes a group containing the at least one of the metallic element and the semi-metallic element, and wherein the organic conductive layer includes a non-metal-containing material that is at least one of an organic conductive material and an organic semiconductor material which does not contain the at least one of the metallic element and the semi-metallic element.

4. The thin film transistor according to claim 1, wherein, the etching gas contains oxygen, the organic semiconductor layer includes a metal-containing material that contains silicon (Si) as a constituent element, and the organic conductive layer includes a non-metal-containing material that does not contain silicon as a constituent element.

5. The thin film transistor according to claim 1, wherein the organic conductive layer is a hole injection layer for enhancing charge injection efficiency between the source and drain electrodes and the organic semiconductor layer.

6. The thin film transistor according to claim 1, wherein the source and drain electrodes mask the organic conductive layer during an etching process.

7. The thin film transistor according to claim 1, further including a second organic semiconductor layer provided between a gate insulating layer and the organic semiconductor layer.

8. The thin film transistor according to claim 7, wherein the second organic semiconductor layer is formed from a non-metal-containing material.

9. The thin film transistor according to claim 7, wherein the second organic semiconductor layer is formed from a metal-containing material.

10. The thin film transistor according to claim 7, wherein the second organic semiconductor layer functions as an etching stopper.

11. The thin film transistor according to claim 1, wherein the etching stopper layer includes a product of (i) at least one of a metallic element and the semi-metallic element of the organic semiconductor layer and (ii) the etching gas.

12. The thin film transistor according to claim 1, wherein the etching stopper layer is disposed on etched portions of the organic semiconductor layer.

13. The thin film transistor according to claim 12, wherein the etching stopper layer reduces an etching rate as the reaction product is built up on the surface of the organic semiconductor layer.

14. The thin film transistor according to claim 1, wherein the reaction product is silicon oxide.

15. The thin film transistor according to claim 1, wherein the first and second portions of the organic conductive layer have a work function approximate to an ionization potential of the organic semiconductor layer.

16. A method of manufacturing a thin film transistor, comprising:

forming an organic semiconductor layer including at least one of a metallic element and a semi-metallic element capable of reacting with an etching gas;

forming an organic conductive layer on portions of a surface of the organic semiconductor layer, wherein the organic conductive layer does not contain the at least one of the metallic element and the semi-metallic element capable of reacting with the etching gas;

forming a source electrode on a first portion of the organic conductive layer;

forming a drain electrode on a second portion of the organic conductive layer, wherein the source electrode and the drain electrode are spaced apart from each other and the source electrode and the drain electrode mask the organic conductive layer during a dry etching process;

dry etching the organic conductive layer not covered by the source and drain electrodes utilizing the etching gas such that the first and second portions of the organic conductive layer are spaced apart from each other forming a void area between the spaced apart first and second portions of the organic conductive layer; and forming an etching stopper layer on portions of the organic semiconductor layer not covered by the organic conductive layer within the void area, and forming the etching stopper layer on portions of the organic semiconductor layer not covered by the organic conductive layer outside of the void area, wherein the etching stopper layer is formed of a reaction product of (i) the at least one of the metallic element and the semi-metallic element of the organic semiconductor layer and (ii) the etching gas.

17. The method of manufacturing a thin film transistor according to claim 16, further comprising forming the etching stopper layer on etched portions of the organic semiconductor layer.

18. The method of manufacturing a thin film transistor according to claim 17, wherein the etching stopper layer reduces an etching rate as the reaction product is built up on the surface of the organic semiconductor layer.

19. An electronic apparatus utilizing a thin film transistor comprising:

an organic semiconductor layer including at least one of a metallic element and a semi-metallic element capable of reacting with an etching gas;

an organic conductive layer disposed on portions of a surface of the organic semiconductor layer, wherein the organic conductive layer does not contain the at least one of the metallic element and the semi-metallic element capable of reacting with the etching gas;

a source electrode disposed on a first portion of the organic conductive layer;

a drain electrode disposed on a second portion of the organic conductive layer, wherein,
 the first and second portions of the organic conductive layer are spaced apart from each other forming a void area between the spaced apart first and second portions of the organic conductive layer,
 the source electrode and the drain electrode are spaced apart from each other,
 the organic conductive layer is sandwiched between the organic semiconductor layer and the source and drain; and an etching stopper layer,
wherein,
 the etching stopper layer is disposed on portions of the organic semiconductor layer not covered by the organic conductive layer within the void area,
 the etching stopper layer is disposed on portions of the organic semiconductor layer not covered by the organic conductive layer outside of the void area, and
 the etching stopper layer includes a reaction product of the organic semiconductor layer and the etching gas.

20. The electronic apparatus according to claim 19, wherein the etching stopper layer includes a product of (i) at least one of a metallic element and the semi-metallic element of the organic semiconductor layer and (ii) the etching gas.

* * * * *